(12) United States Patent
Kaneda et al.

(10) Patent No.: US 7,582,974 B2
(45) Date of Patent: Sep. 1, 2009

(54) SEMICONDUCTOR DEVICE AND METHOD OF MANUFACTURING SAME

(75) Inventors: Yoshiharu Kaneda, Sakai (JP); Motoaki Shimizu, Sakai (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/099,961

(22) Filed: Apr. 9, 2008

(65) Prior Publication Data

US 2008/0246166 A1    Oct. 9, 2008

(30) Foreign Application Priority Data

Apr. 9, 2007    (JP)    ............................. 2007-101799

(51) Int. Cl.
  *H01L 23/48*    (2006.01)
(52) U.S. Cl. ........................ 257/783; 257/773; 257/786; 257/787; 257/E23.04; 257/E21.514; 438/119
(58) Field of Classification Search ......... 257/666–667, 257/783, 784, 787, 733–796, E23.31–E23.059, 257/E21.499; 438/119
See application file for complete search history.

(56) References Cited

U.S. PATENT DOCUMENTS 6,197,615 B1 *    3/2001    Song et al. ................... 438/111
6,720,206 B2 *    4/2004    Choi ........................... 438/114

FOREIGN PATENT DOCUMENTS

JP    9-92778    4/1997

* cited by examiner

*Primary Examiner*—Jasmine J Clark
(74) *Attorney, Agent, or Firm*—Young & Thompson (57) ABSTRACT

A semiconductor device that improves adhesion between a resin and a die pad and prevents cracking of the resin includes: a semiconductor chip; a die pad on which the semiconductor chip is mounted; a bonding agent for bonding the semiconductor chip to the die pad; a plurality of inner leads provided at the outer periphery of the die pad; outer leads extending from the inner leads; bonding wires connecting the inner leads to the semiconductor chip mounted on the die pad; and a resin for sealing the inner leads, the die pad, the semiconductor chip, the bonding agent and the bonding wires. The bonding agent is further disposed in all or part of a margin of the die pad at a peripheral portion where the semiconductor chip is mounted, and a plurality of dimples are formed in the surface of the bonding agent in the die pad margin.

16 Claims, 10 Drawing Sheets

SEMICONDUCTOR DEVICE AND METHOD OF MANUFACTURING SAME

REFERENCE TO RELATED APPLICATION

This application is based upon and claims the benefit of the priority of Japanese patent application No. 2007-101799, filed on Apr. 9, 2007, the disclosure of which is incorporated herein in its entirety by reference thereto.

FIELD OF THE INVENTION

This invention relates to a semiconductor device and to a method of manufacturing a semiconductor device.

BACKGROUND OF THE INVENTION

In conventional semiconductor devices, use is made of a lead frame 101 (see FIG. 7) when packaging a semiconductor chip (die). The lead frame 101 is obtained by forming a strip-shaped thin metal plate of superior mechanical strength, electrical conductivity, thermal conductivity and corrosion resistance, such as a Cu-based material or Fe-based material, into a desired shape by pressing work or an etching process. The lead frame 101 has die pad 102; a plurality of inner leads 103 extending toward the outer periphery of the die pad 102 with a prescribed spacing between them and the die pad 102; a tie bar 104 integrally connected to the inner leads 103; outer leads 105 connected to the inner leads 103 and extending toward the outer side of the inner leads 103; a side rail 106 to which the outer leads 105 are connected; and support bars 107 that support the die pad 102.

Figure 8:
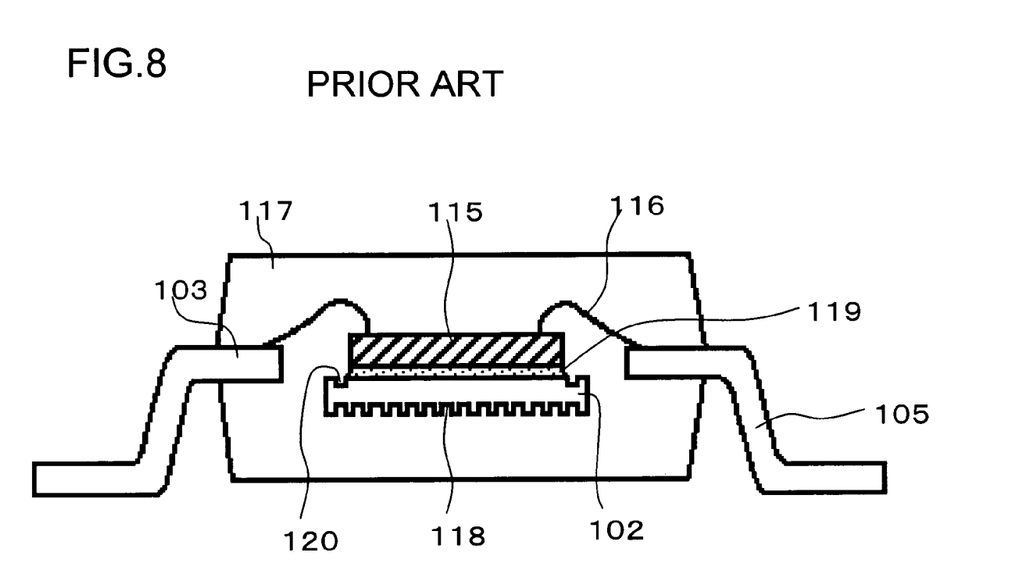
FIG. 8 is a sectional view schematically illustrating the structure of the semiconductor device according to the prior art.

As illustrated in FIG. 8, the semiconductor device using the lead frame 101 has a semiconductor chip 115 fixedly secured on the die pad 102 (island) of the lead frame 101 via a bonding agent comprising solder or the like. Terminals (not shown) of the semiconductor chip 115 are connected to the inner leads 103 of the lead frame 101 by bonding wires 116 comprising gold wire or aluminum wire, etc., and the outer leads 105 of the lead frame 101 are lead out to the exterior. An assembly comprising at least the semiconductor chip 115, die pad 102, inner leads 103 and bonding wires 116 is sealed within a resin 117.

In a method of manufacturing such a semiconductor device, the semiconductor chip 115 is mounted on the bonding agent 119 after the bonding agent 119 is applied to the surface of the die pad 102 of the lead frame 101. This is followed by connecting the terminals (not shown) of the semiconductor chip 115 and the inner leads 103 of the lead frame 101 by the bonding wires 116, then leading the outer leads 105 of the lead frame 101 to the exterior and then sealing the assembly, which comprises at least the semiconductor chip 115, die pad 102, inner leads 103 and bonding wires 116, in the resin 117. This is followed by cutting off the tie bar 104 and side rail 106 and forming the outer leads 105, which extend from the resin 117, into the desired shape to thereby complete manufacture.

In order to improve the adhesion between the die pad 102 and resin 117 in a conventional semiconductor device, a technique in which the top and bottom surfaces of the die pad 102 are provided with dimples 118 and 120 beforehand at fabrication of the lead frame has been disclosed (see Patent Document 1).

[Patent Document 1]
Japanese Patent Kokai Publication No. JP-A-9-92778 (FIGS. 1 and 2)

SUMMARY OF THE DISCLOSURE

The following analyses are given by the present invention. The entire disclosure of the above mentioned patent document is incorporated herein by reference thereto.

Figure 9:
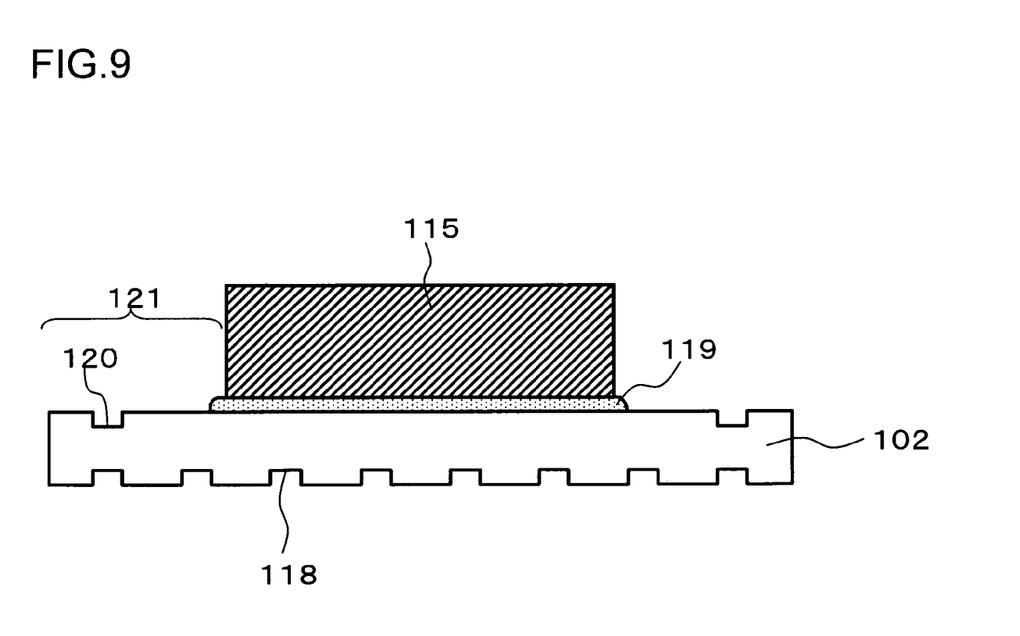
FIG. 9 is a sectional view schematically illustrating the structure of an assembly comprising a die pad, bonding agent and semiconductor chip in the semiconductor device showing an analysis of a problem of the prior art.
Figure 10:
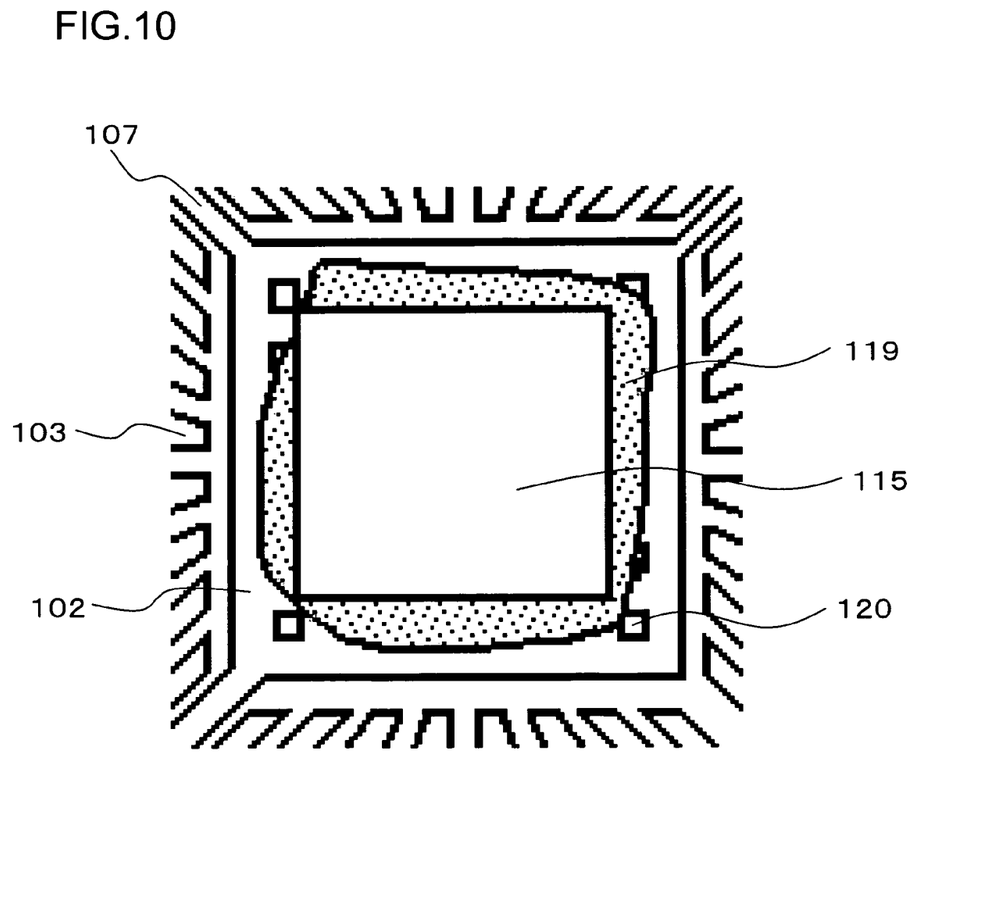
FIG. 10 is a sectional view schematically illustrating the structure of an assembly comprising a die pad, bonding agent and semiconductor chip in the semiconductor device showing an analysis of the problem of the prior art.

In this semiconductor device, the top-side dimples 120 on the side of the die pad 102 facing the semiconductor chip 115 are provided in a margin (peripheral portion) 121 of the die pad 102, namely at a peripheral portion where the semiconductor chip 115 is mounted (see FIG. 9). However, the top-side dimples 120 in the margin 121 of the die pad 102 become filled with the bonding agent 119 when the bonding agent 119 is applied and hence the function of improving the adhesion of the resin 117 (FIG. 8) to the top surface is not realized (see FIG. 10). On the other hand, the bottom-side dimples 118 formed in the bottom surface of the die pad 102 do contribute to an improvement in the adhesion of the resin 117 to the bottom surface. Consequently, owing to this difference in adhesion to the top and bottom surfaces of the die pad 102, stress develops in the resin 117 and the resin cracks. This is a problem that remains unsolved. Specifically, the resin peels off owing to a decline in the adhesion of the resin 117 (FIG. 8) to the margin 121 (FIG. 9) of the die pad 102, resin cracking arises at gaps where peeling has occurred and the reliability of the product is diminished.

The present invention seeks to improve adhesion of resin to the margin of a die pad and prevent resin cracking.

According to a first aspect of the present invention, there is provided a semiconductor device comprising: a semiconductor chip; a die pad on which the semiconductor chip is mounted; a bonding agent for bonding the semiconductor chip to the die pad; and a resin for sealing an assembly comprising at least the die pad, semiconductor chip and bonding agent. The bonding agent is further placed on all or part of a margin of the die pad at a peripheral portion where the semiconductor chip is mounted, and a plurality of dimples are formed in the surface of the bonding agent.

Preferably, the semiconductor device according to the first aspect of the present invention further comprises: a plurality of inner leads provided at the outer periphery of the die pad; outer leads extending from the inner leads; and bonding wires connecting the inner leads to the semiconductor chip. The resin seals an assembly comprising at least the inner leads, die pad, semiconductor chip, bonding agent and bonding wires.

Preferably, in the semiconductor device according to the first aspect of the present invention, the die pad has a outer wall portion provided on a side of the die pad that faces the semiconductor chip, the wall portion is spaced a prescribed distance away from an edge of the semiconductor chip. The bonding agent is disposed in an area between the wall portion and the semiconductor chip, and the dimples are formed in the bonding agent in this area.

Preferably, in the semiconductor device according to the first aspect of the present invention, the die pad is formed to have a plurality of dimples in the side thereof opposite the side facing the semiconductor chip.

Preferably, in the semiconductor device according to the first aspect of the present invention, the bonding agent is solder.

According to a second aspect of the present invention, there is provided a method of manufacturing a semiconductor device, comprising: applying a bonding agent to a die pad; mounting a semiconductor chip on the bonding agent; connecting the semiconductor chip and inner leads by bonding wires; and sealing an assembly in resin. The assembly comprises at least the inner leads, die pad, semiconductor chip, bonding agent and bonding wires. At the step of applying the bonding agent, the bonding agent is applied also on at least a part of a margin of the die pad on a side thereof that faces the semiconductor chip, and dimples are formed in the surface of the bonding agent, which has been disposed in the margin.

The meritorious effects of the present invention are summarized as follows.

In accordance with the present invention, the bonding agent also is provided with dimples. As a result, the bonding agent bites into the resin owing to an anchoring effect at the location of the dimples, the adhesion of the resin to the margin of the die pad is improved and the occurrence of resin cracking can be prevented.

Other features and advantages of the present invention will be apparent from the following description taken in conjunction with the accompanying drawings, in which like reference characters designate the same or similar parts throughout the figures thereof.

PREFERRED MODES OF THE INVENTION

Figure 1:
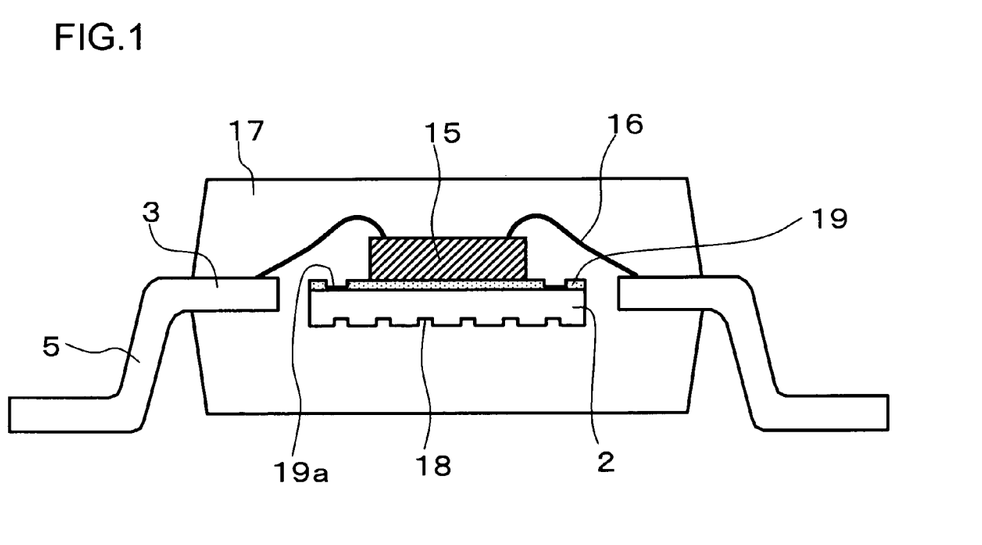
FIG. 1 is a sectional view schematically illustrating the structure of a semiconductor device according to a first exemplary embodiment of the present invention.
Figure 2A:
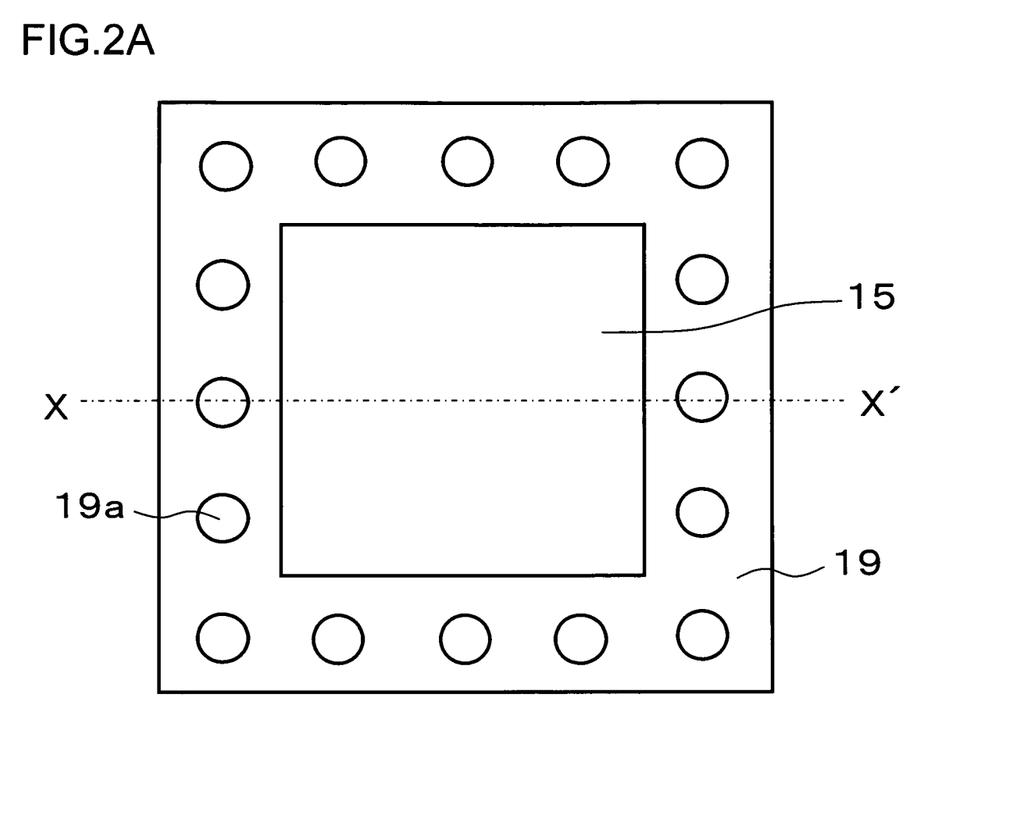
FIG. 2A is a plan view schematically illustrating the structure of an assembly comprising a die pad, bonding agent and semiconductor chip in the semiconductor device according to the first exemplary embodiment.
Figure 2B:
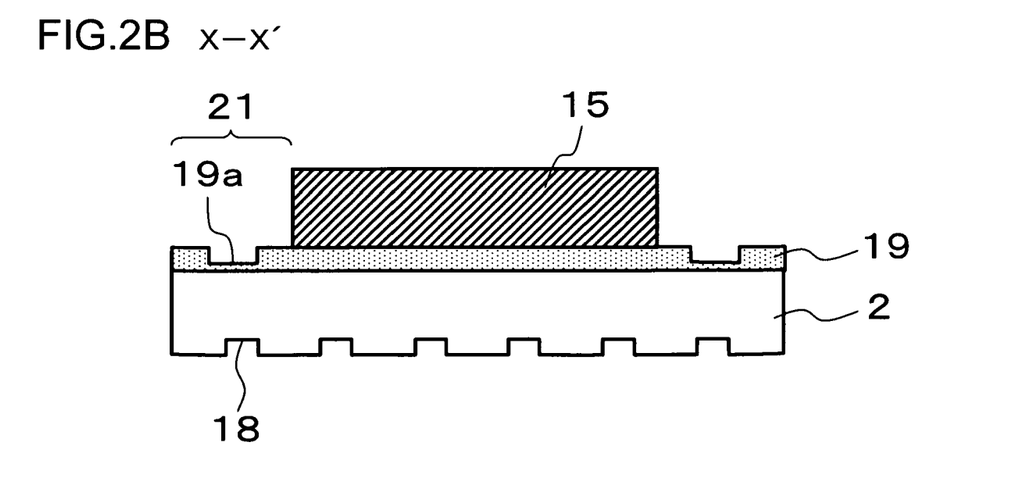
FIG. 2B is a sectional view taken along line X-X' in FIG. 2A.

Preferred modes of the present invention will be described in detail with reference to the drawings First Exemplary Embodiment A semiconductor device according to a first exemplary embodiment of the present invention will now be described with reference to the drawings, in which FIG. 1 is a sectional view schematically illustrating the structure of a semiconductor device according to the first exemplary embodiment, FIG. 2A is a plan view schematically illustrating the structure of an assembly comprising a die pad, bonding agent and semiconductor chip in the semiconductor device according to the first exemplary embodiment, and FIG. 2B is a sectional view taken along line X-X' in FIG. 2A.

Figure 7:
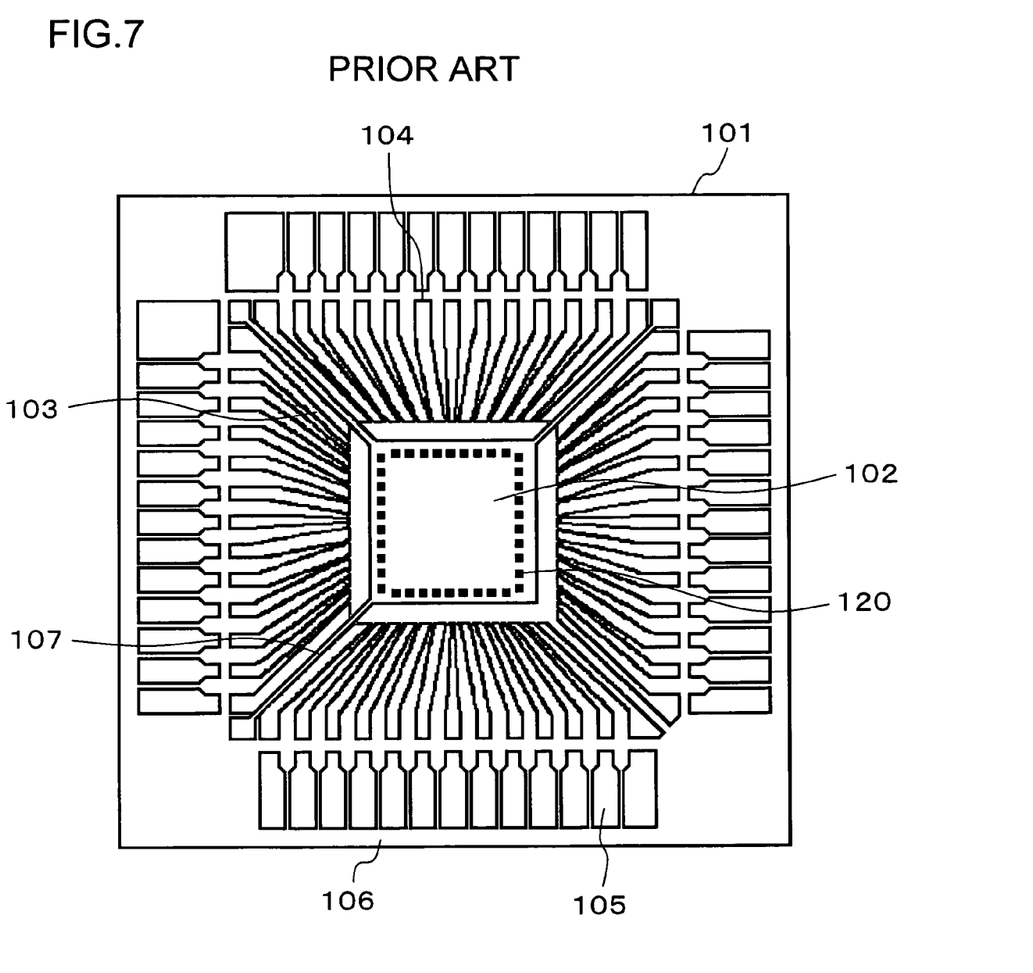
FIG. 7 is a plan view schematically illustrating the structure of a lead frame used in a semiconductor device according to an example of the prior art.

The semiconductor device is one manufactured using a lead frame, which corresponds to the lead frame 101 shown in FIG. 7, for example. The semiconductor device has a die pad 2, inner leads 3, outer leads 5, a semiconductor chip 15, bonding wires 16, resin 17 and bonding agent 19.

The die pad 2 is the portion of the device on which the semiconductor chip 15 is mounted. The inner leads 3 and outer leads 5 are formed of similar material. A plurality of bottom-side dimples 18 are formed in the side of the die pad 2 that is opposite the side facing the semiconductor chip 15. The semiconductor chip 15 is bonded by the bonding agent 19 to the side of the die pad 2 that faces the semiconductor chip 15. The die pad 2 is adapted to be larger than the semiconductor chip 15 in terms of its planar region. The bonding agent 19 is disposed on all or part of a margin 21 of the die pad 2 on the side thereof that faces the semiconductor chip 15 also at the peripheral portion additionally to a portion where the semiconductor chip 15 is mounted.

The inner leads 3 are wiring portions extending toward the outer periphery of the die pad 2 with a prescribed spacing between the inner leads and the die pad 2. The inner leads 3 are formed of a material exhibiting superior mechanical strength, electrical conductivity, thermal conductivity and corrosion resistance, examples of which are a Cu-based material or Fe-based material. The inner leads 3 are connected to corresponding ones of the outer leads 5 and are connected to corresponding terminals (not shown) by the bonding wires 16. The outer leads 5 are wiring portions connected to the inner leads 3 and extend outwardly of the inner leads 3. The outer leads 5 are made of a material exhibiting superior mechanical strength, electrical conductivity, thermal conductivity and corrosion resistance, examples of which are a Cu-based material or Fe-based material.

The semiconductor chip 15 is an electronic component having a semiconductor element and has a plurality of terminals (not shown) on the side thereof opposite the side facing the die pad 2. The semiconductor chip 15 is bonded to the central portion of the die pad 2 by the bonding agent 19. The terminals (not shown) of the semiconductor chip 15 are connected to the corresponding inner leads 3 by the bonding wires 16.

The bonding wires 16 are wires connecting the terminals (not shown) of the semiconductor chip 15 and the corresponding inner leads 3 and are made of gold wire or aluminum wire, by way of example.

The resin 17 is an insulating resin that seals an assembly comprising at least the semiconductor chip 15, bonding agent 19, die pad 2, inner leads 3 and bonding wires 16. The outer leads 5 are lead out to the outer periphery of the edges of the package sealed by the resin 17.

The bonding agent 19 is for bonding the semiconductor chip 15 to the die pad 2. Use can be made of a bonding agent such as solder that makes it possible to form dimples 19a by a pressing jig 31 (see FIG. 3). The bonding agent 19 is disposed also on the margin 21 of the die pad on a side thereof that faces the semiconductor chip 15 at the peripheral portion additionally to a portion where the semiconductor chip is mounted. The bonding agent 19 is formed to have a plurality of the dimples (small recesses) 19a in the margin 21.

Although there is no particular limitation with regard to the size, depth and layout of the dimples 19a, it is preferred from the standpoint of stress that the symmetry of the package be taken into consideration and that the dimples 19a be formed at positions having symmetry with respect to the axis of symmetry.

It should be noted that this exemplary embodiment has been described taking as an example a semiconductor device of wire-bonded package type. However, as long as the device is a semiconductor device having a structure in which an assembly comprising at least a die pad, semiconductor chip and bonding agent is sealed in resin, the invention is applicable also to a semiconductor device of flip-chip package type that comprises bumps, for example, formed on the semiconductor chip as outer terminals of the semiconductor device.

Figure 3:
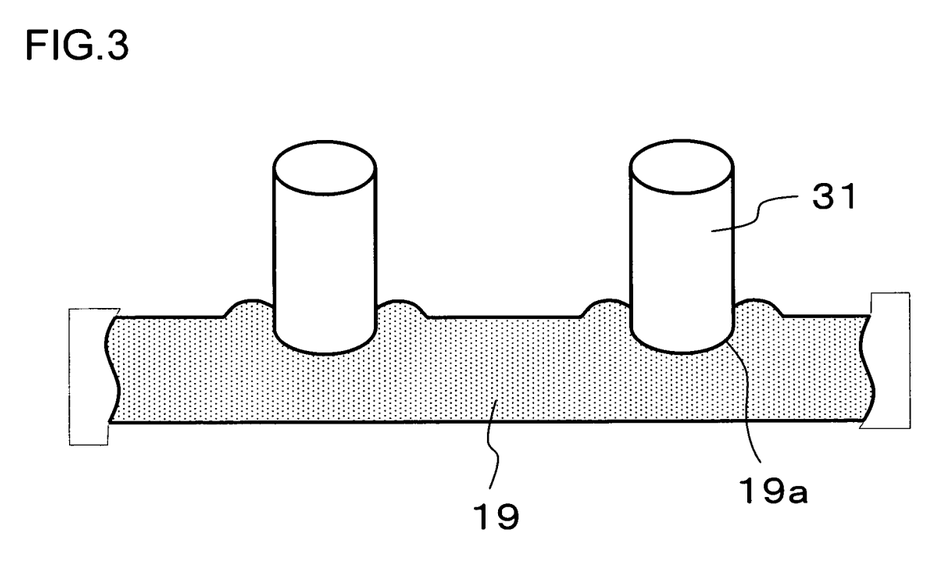
FIG. 3 is a schematic view illustrating the manner in which dimples are formed in a bonding agent in the semiconductor device according to the first exemplary embodiment.
Figure 4A:
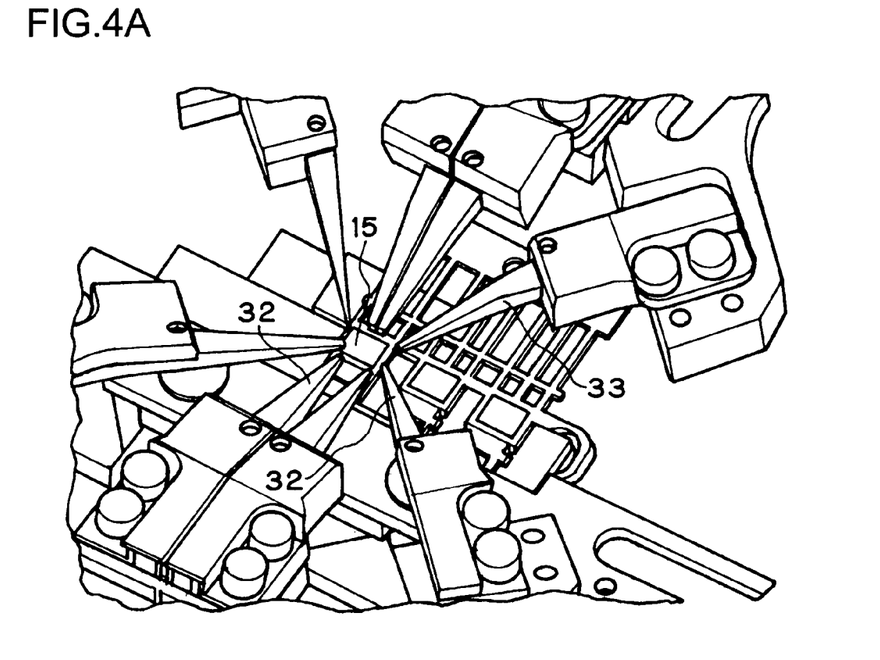
FIG. 4A is a perspective view schematically illustrating a clamping portion of an apparatus for manufacturing the semiconductor device according to the first exemplary embodiment.
Figure 4B:
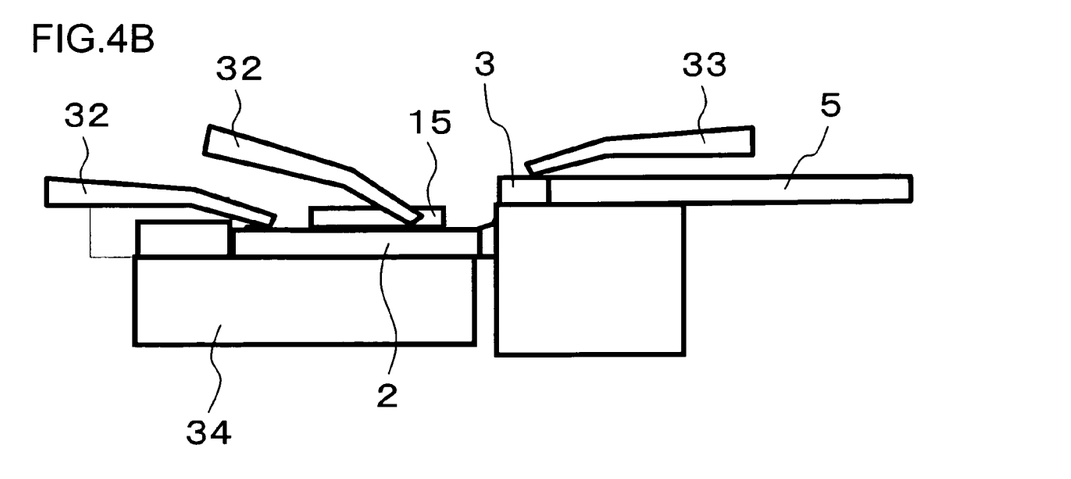
FIG. 4B is a partial sectional view of the apparatus.

Next, a method of manufacturing a semiconductor device according to the first exemplary embodiment of the present invention will be described with reference to the drawings. FIG. 3 is a schematic view illustrating the manner in which dimples are formed in a bonding agent in the semiconductor device according to the first exemplary embodiment, FIG. 4A is a perspective view schematically illustrating a clamping portion of an apparatus for manufacturing the semiconductor device according to the first exemplary embodiment, and FIG. 4B is a partial sectional view of the apparatus.

First, after the bonding agent 19 is applied to all or part of the surface of one side of the die pad 2 of the lead frame (which corresponds to lead frame 101 in FIG. 7), the semiconductor chip 15 is mounted on the bonding agent 19.

Next, the terminals (not shown) of the semiconductor chip 15 and the inner leads 3 of the lead frame are connected by the bonding wires 16. At the time of the bonding step, lead frame is placed on an assembly block 34, the margin 21 (see FIG. 2B) of the die pad 2 surrounding the semiconductor chip 15 is pressed by a pressing jig 32, some of the inner leads 3 are pressed by a pressing jig 33, as illustrated in FIGS. 4A and 4B, in order that the lead frame may be fixed to allow bonding to proceed. Instead of using the pressing jig 32 shown in FIGS. 4A and 4B, therefore, use is made of a columnar or pyramidal pressing jig 31 of the kind shown in FIG. 3, and the pressing jig 31 is made to apply pressure to the surface of the bonding agent 19 in the vertical direction, thereby enabling the formation of the dimples 19a in the surface of the bonding agent 19.

Next, the outer leads 5 of the lead frame are led out to the exterior and the assembly comprising at least the semiconductor chip 15, die pad 2, inner leads 3 and bonding wires 16 is sealed in the resin 17.

This is followed by cutting off the tie bar (which corresponds to the tie bar 104 in FIG. 7) and side rail (which corresponds to the side rail 106 in FIG. 7) and forming the outer leads 5, which extend from the resin 17, into the desired shape to thereby complete manufacture.

Next, the semiconductor device according to the first exemplary embodiment of the present invention will be described while comparing it with a comparative example.

Ten samples of the exemplary embodiment having the dimples 19a in the bonding agent 19, as shown in FIG. 1, and ten samples for comparison not having dimples in the bonding agent were investigated using an SAT (Scan Acoustic Tomograph) apparatus. It was found that whereas all ten of the comparative samples exhibited peeling defects, two of the samples of the exemplary embodiment exhibited peeling but within allowable limits; the number of defective samples was zero. This represents a major improvement.

In accordance with the first exemplary embodiment, the dimples 19a are provided in the bonding agent 19 after the bonding agent 19 is applied. As a result, the dimples 19a are not filled with anything other than the resin 17 and the adhesion between the bonding agent 19 in the margin 21 and the resin 17 can be improved. In other words, in the first exemplary embodiment, it is possible to prevent a decline in the adhesion between the resin (117 in FIG. 8) and the bonding agent (119 in FIG. 8) in the margin (121 in FIG. 9) ascribable to the fact that the dimples 120 in the surface of the die pad 102 become filled with the bonding agent 119 (see FIG. 10) as described above. As a result, peeling between the resin (117 in FIG. 8) and the bonding agent (119 in FIG. 8) in the margin (121 in FIG. 9) is inhibited and the problem of cracks in the resin can be mitigated. Since it is not necessary to add on a new step in regard to the formation of the dimples 19a in the bonding agent 19, the industrial process is efficient.

Second Exemplary Embodiment

Figure 5:
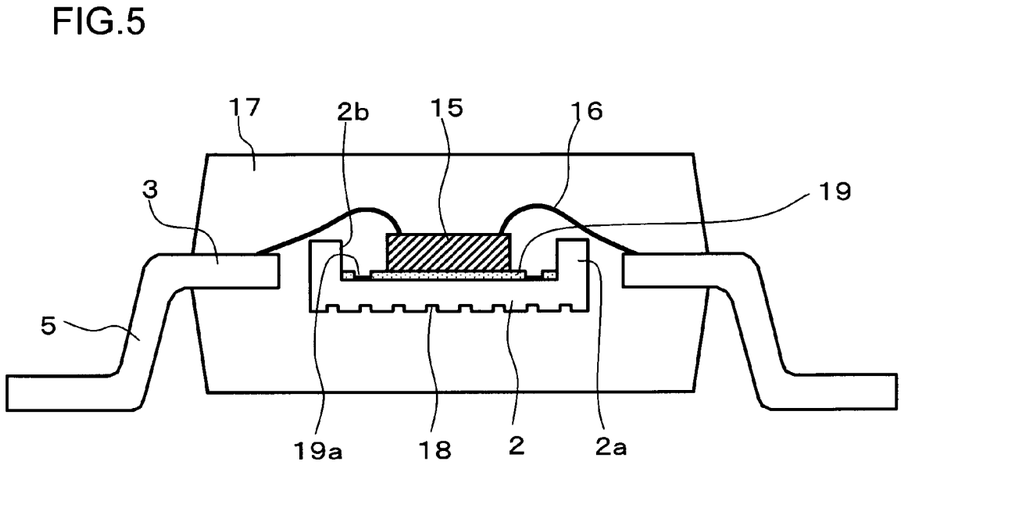
FIG. 5 is a sectional view schematically illustrating the structure of a semiconductor device according to a second exemplary embodiment of the present invention.
Figure 6A:
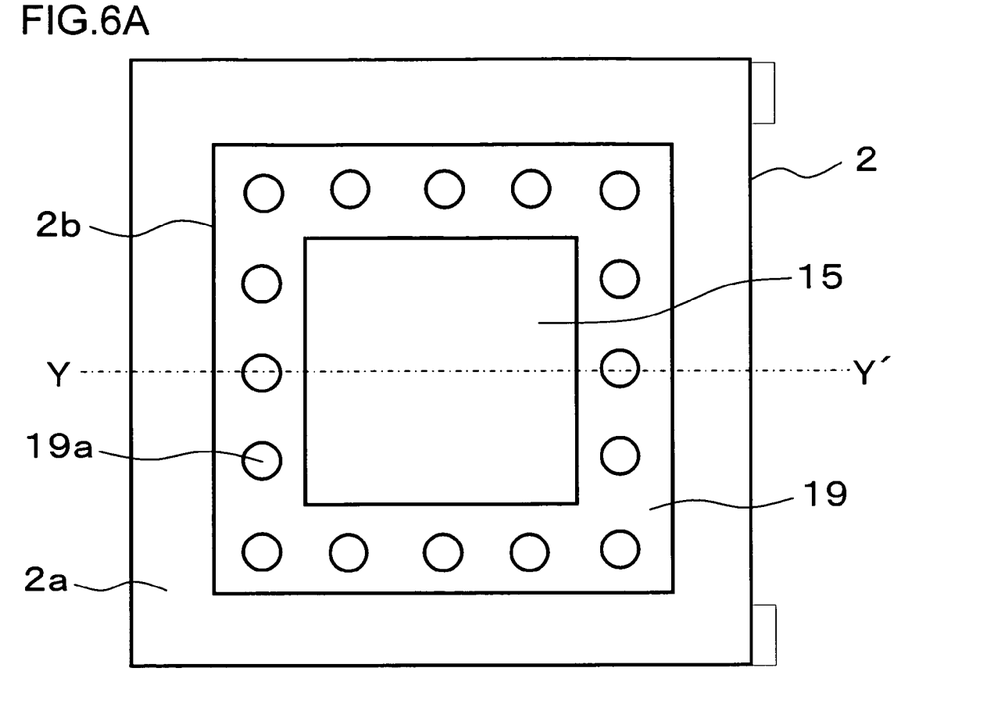
FIG. 6A is a plan view schematically illustrating the structure of an assembly comprising a die pad, bonding agent and semiconductor chip in the semiconductor device according to the second exemplary embodiment.
Figure 6B:
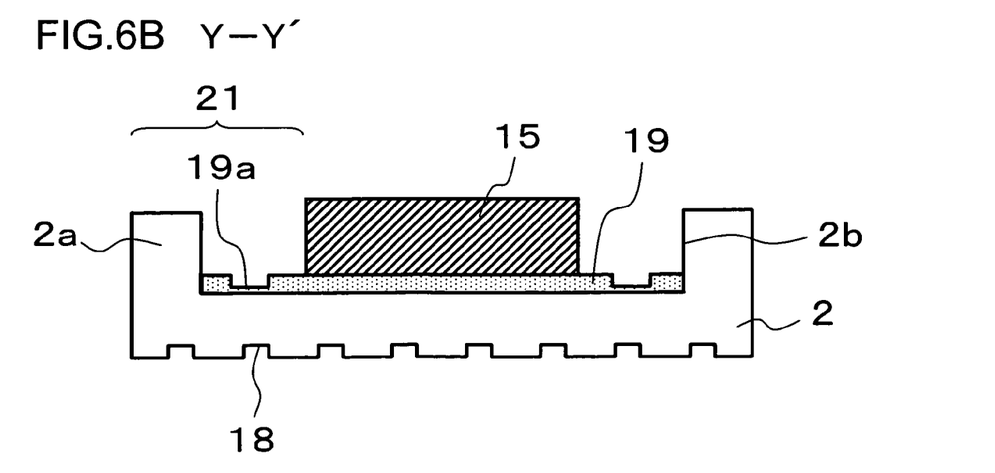
FIG. 6B is a sectional view taken along line Y-Y' in FIG. 6A.

A semiconductor device according to a second exemplary embodiment of the present invention will be described with reference to the drawings, in which FIG. 5 is a sectional view schematically illustrating the structure of a semiconductor device according to a second exemplary embodiment of the present invention, FIG. 6A is a plan view schematically illustrating the structure of an assembly comprising a die pad, bonding agent and semiconductor chip in the semiconductor device according to the second exemplary embodiment, and FIG. 6B is a sectional view taken along line Y-Y' in FIG. 6A.

In the second exemplary embodiment, the die pad 2 has a frame-shaped outer wall portion 2a (wall portion) provided on the side of the die pad 2 that faces the semiconductor chip 15. The outer wall portion 2a is constructed as an integral part of the die pad 2. The inner peripheral side of the outer wall portion 2a defines a portion 2b for accommodating the semiconductor chip 15. The inner peripheral surface of the outer wall portion 2a is spaced a prescribed distance away from the edge of the semiconductor chip 15. The bonding agent 19 is placed in the area between the outer wall portion 2a and the semiconductor chip 15, and the dimples 19a are formed in the bonding agent 19 in this area. Other structural aspects are similar to those of the first exemplary embodiment.

In accordance with the second exemplary embodiment, the die pad 2 is provided with the outer wall portion 2a. As a result, the bonding agent 19 can be prevented from being thrust toward the periphery of the die pad 2 when the bonding agent 19 is spread or when the dimples 19a are formed. This makes it possible to design the dimples 19a freely without requiring any restriction with regard to the size, depth and number of dimples 19a.

As many apparently widely different exemplary embodiments of the present invention can be made without departing from the spirit and scope thereof, it is to be understood that the invention is not limited to the specific exemplary embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a semiconductor chip;
   a die pad on which said semiconductor chip is mounted;
   a bonding agent bonding said semiconductor chip to said die pad; and a resin sealing an assembly comprising at least said die pad, said semiconductor chip and said bonding agent;

wherein said bonding agent is placed on at least a part of a margin of the die pad on a side thereof that faces said semiconductor chip, and a plurality of dimples are formed in the surface of said bonding agent and are filled by said resin.

2. The device according to claim 1, further comprising:

a plurality of inner leads provided at the outer periphery of said die pad;

outer leads extending from said inner leads; and bonding wires connecting said inner leads to said semiconductor chip;

wherein the resin seals an assembly comprising at least said inner leads, said die pad, said semiconductor chip, said bonding agent and said bonding wires.

3. The device according to claim 1, wherein said die pad has a wall portion provided on a side of said die pad that faces said semiconductor chip;

said wall portion is spaced a prescribed distance away from an edge of said semiconductor chip;

said bonding agent is disposed in an area between said wall portion and said semiconductor chip; and the dimples are formed in said bonding agent in the area between said wall portion and said semiconductor chip.

4. The device according to claim 1, wherein said die pad is formed to have a plurality of dimples in the side thereof opposite the side facing said semiconductor chip.

5. The device according to claim 1, wherein bonding agent is solder.

6. The semiconductor device according to claim 1, wherein said plurality of dimples are formed in the surface of said bonding agent adjacent said semiconductor chip.

7. A method of manufacturing a semiconductor device, comprising:

applying a bonding agent to a die pad;

mounting a semiconductor chip on the bonding agent;

connecting the semiconductor chip and inner leads by bonding wires; and sealing an assembly in resin, said assembly comprising at least the inner leads, die pad, semiconductor chip, bonding agent and bonding wires;

wherein at said applying the bonding agent, the bonding agent is applied also on at least a part of a margin of the die pad on a side thereof that faces the semiconductor chip, and dimples are formed in the surface of the bonding agent, which has been disposed in the margin, and said dimples are filled by the resin.

8. The method according to claim 7, wherein the dimples are formed when the connections are made by the bonding wires.

9. The method according to claim 7, wherein the dimples are formed when before the connections are made by the bonding wires.

10. The method of manufacturing the semiconductor device according to claim 7, wherein said dimples are formed in the surface of the bonding agent adjacent said semiconductor chip.

11. A semiconductor device assembly comprising:

a die pad;

a semiconductor chip mounted on said die pad;

a bonding agent formed between said die pad and said semiconductor chip, said bonding agent having a first surface adjacent said semiconductor chip and a second surface adjacent said die pad; and at least one dimple formed in said first surface of said bonding agent.

12. The semiconductor device assembly according to claim 11, further comprising a plurality of dimples formed in said first surface of said bonding agent, wherein said bonding agent is formed at a margin of said die pad.

13. The semiconductor device assembly according to claim 12, wherein said dimples are only formed at said margin of said die pad.

14. The semiconductor device assembly according to claim 11, further comprising a plurality of dimples, wherein said dimples surround said semiconductor chip.

15. The semiconductor device according to claim 11, further comprising a resin, wherein said resin seals said semiconductor device assembly.

16. The semiconductor device assembly according to claim 11, wherein a surface of said die pad adjacent to said second surface of said bonding agent is substantially planar.

* * * * *